United States Patent [19]
Nikulin

[11] Patent Number: 6,164,240
[45] Date of Patent: *Dec. 26, 2000

[54] SEMICONDUCTOR WAFER PROCESSOR, PLASMA GENERATING APPARATUS, MAGNETIC FIELD GENERATOR, AND METHOD OF GENERATING A MAGNETIC FIELD

[75] Inventor: Serge L. Nikulin, Palo Alto, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/046,986

[22] Filed: Mar. 24, 1998

[51] Int. Cl.$^7$ .................................................. C23C 16/458
[52] U.S. Cl. ......................................... 118/723 I; 118/728
[58] Field of Search ........................... 118/723 MA, 723; 315/111.21; 427/38

[56] References Cited

U.S. PATENT DOCUMENTS

| | | | |
|---|---|---|---|
| 4,996,077 | 2/1991 | Moslehi et al. | 427/38 |
| 5,041,760 | 8/1991 | Koloc | 315/111.41 |
| 5,105,761 | 4/1992 | Charlet et al. | 118/723 |
| 5,505,780 | 4/1996 | Dalvie et al. | 118/723 MA |

OTHER PUBLICATIONS

Purcell, Edward M., "Electricity And Magnetism", *Berkeley Physics Course*, Second Edit., Education Development Center, McGraw–Hill Book Company, vol. 2, pp. 247–248; 281–282; 285–286 (1965).

Lieberman, Michael A., et al., *Principles Of Plasma Discharges And Materials Processing*, "Plasma Dynamics", Wiley–Interscience Publication, John Wiley & Sons, Inc., Chapter 4, pp. 85–128; 146–153; 373–378; 388–396; 465–471 (1994).

McGraw–Hill Dictionary of Scientific and Technical Terms© 1994, definitions taken from pp. 919 and 2044, 2 pages.

Hosoya et al, Rev. Sci. Instrum. 62 (10), Oct. 1991.
Kaminishi et al, Rev. Sci. Instrum. 52 (3), Mar. 1981.
L.B. Luganskii, Soviet Physics, 31 (5), May 1986.
Petrov et al, JVAC A, 10 (5), Sep. 1992.

*Primary Examiner*—Gregory Mills
*Assistant Examiner*—Rudy Zervigon
*Attorney, Agent, or Firm*—Wells, St. John, Roberts, Gregor & Matkin

[57] ABSTRACT

A semiconductor wafer processor includes a chamber having a wafer support. A magnetic field generator is configured to generate a magnetic field within the chamber at a location proximate a surface of a wafer received by the wafer support. The magnetic field generator comprises a plurality of conductors within the chamber proximate the support which radiate outwardly from a substantially common origin to a periphery. The origin and periphery can be in the same or multiple planes. In one embodiment, the magnetic field generator includes a first plurality of conductors radiating outwardly from a first origin to a first periphery, and a second plurality of conductors annularly radiating outwardly from an annular second origin to an annular second periphery. The first periphery is received at least partially within the second annular periphery. The generator can be utilized apart from a semiconductor wafer processor, such as for example in an electric motor or plasma generating apparatus.

59 Claims, 5 Drawing Sheets

SEMICONDUCTOR WAFER PROCESSOR, PLASMA GENERATING APPARATUS, MAGNETIC FIELD GENERATOR, AND METHOD OF GENERATING A MAGNETIC FIELD

TECHNICAL FIELD

This invention relates to semiconductor wafer processors, plasma generating apparatus, magnetic field generators, electric motors, and to methods of generating magnetic fields.

BACKGROUND OF THE INVENTION

Plasma discharges are widely used in semiconductor wafer processing to modify the surface properties of materials. A plasma is a collection of free charged particles moving in random directions that is, on the average, electrically neutral. Plasmas can be chemically reactive or inert, and among other things are utilized to either deposit or etch materials from a substrate surface such as semiconductor wafer.

Magnetically enhanced plasma discharges are utilized, for example, to increase plasma density and to reduce voltage at the sheath of the plasma for a given power. A magnetic field can facilitate confinement of the ionizing electrons to a small volume near the surface of a semiconductor wafer. Although magnetically enhancing a plasma discharge can result in reduced sheath voltage and increase plasma density, many prior art generated plasmas are strongly non-uniform radially and azimuthally. Such results in less than desirable process uniformity. It has been proposed that to increase process uniformity, at least azimuthally, the magnetic field can be rotated in the plane of the wafer at a low frequency, but this apparently has not met with much success.

It would be desirable to develop improved methods and apparatus for generating a magnetic field associated with semiconductor wafer plasma processors and processing. While commercially motivated from this primary objective, the reader will appreciate applicability of the invention in other art areas, with the invention only being limited by the accompanying claims appropriately interpreted in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
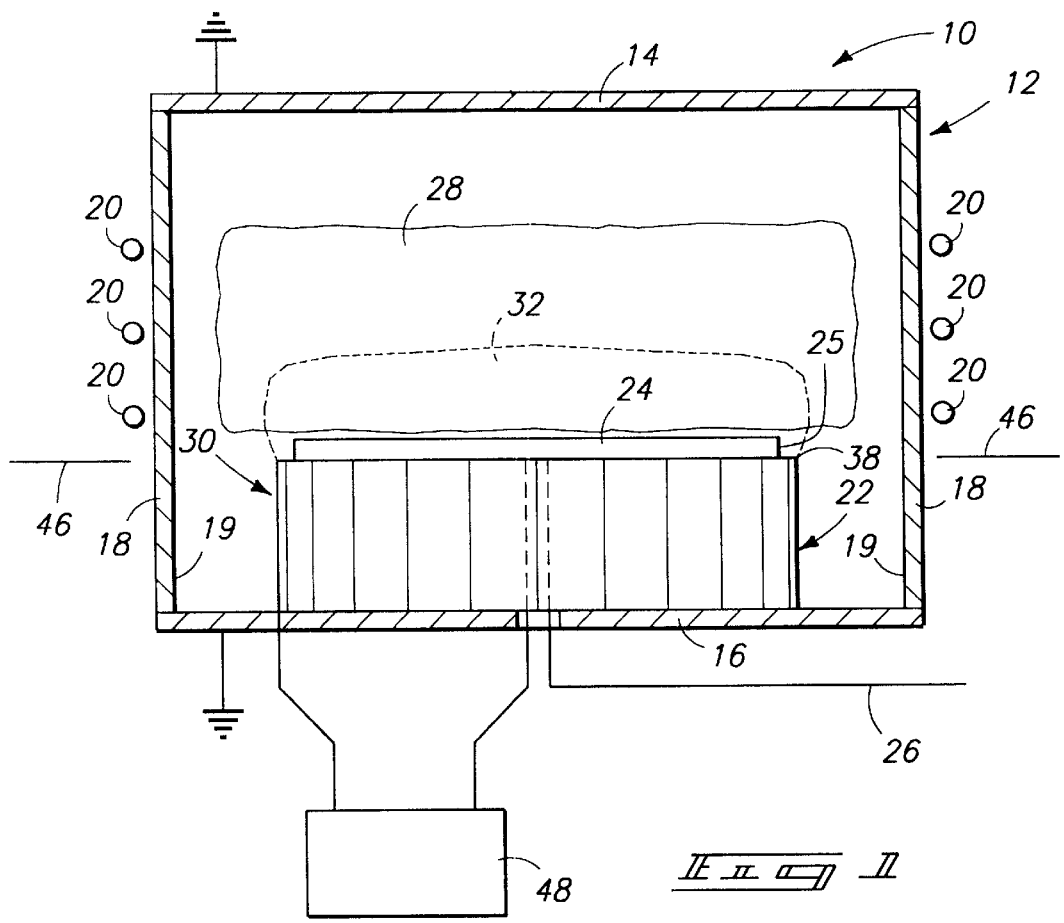
FIG. 1 is a diagrammatic partially sectional view of a semiconductor wafer processor in accordance with one aspect of the invention.

Referring to FIG. 1, a semiconductor wafer processor is indicated generally with reference numeral 10. Such is illustrated in the form of an inductively coupled plasma reactor comprising a chamber 12 having top and bottom metallic walls 14 and 16, respectively, each of which is grounded. Chamber 12 includes dielectric sidewalls 18 having Rf inducing coils 20 received thereabout. Chamber 12 includes a wafer support 22 which holds a wafer 24 thereatop for processing. For purposes of the continuing discussion, wafer 24 has a periphery 25. An Rf bias is preferably applied to wafer 24 through wafer support 22 through an Rf bias line 26. The apparatus can be utilized to produce a plasma region 28 above wafer 24 using a conventional Rf power supply through a suitable capacitive matching network (not shown).

Figure 2:
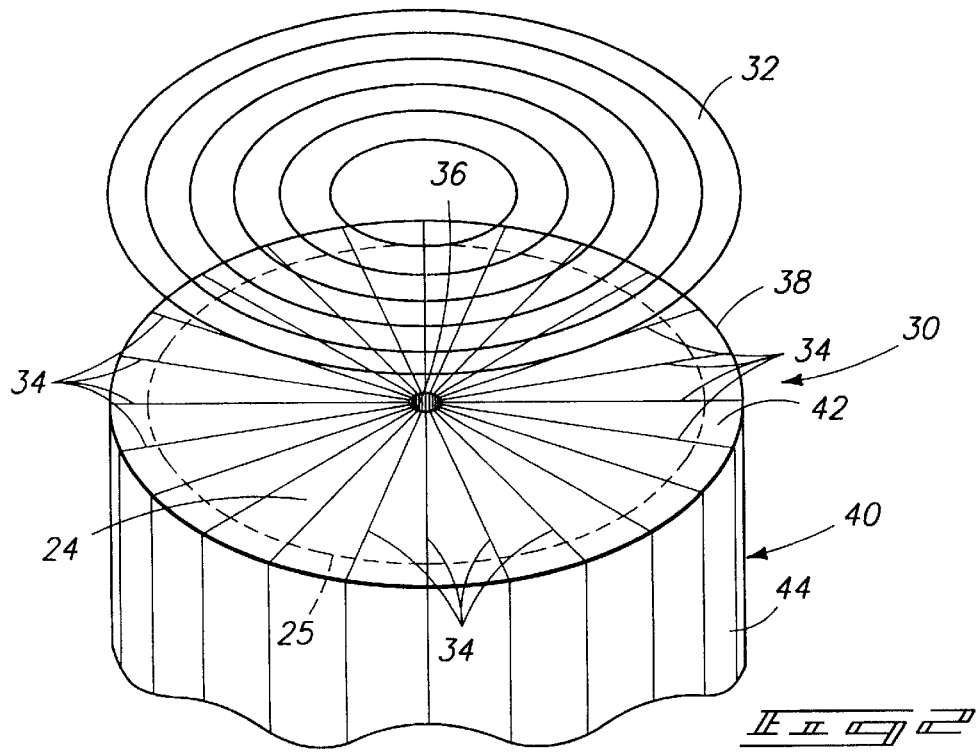
FIG. 2 is an enlarged perspective view of a portion of the processor of FIG. 1.

Referring to FIGS. 1 and 2, wafer processor 10 comprises a magnetic field generator 30 configured to generate a magnetic field 32 within chamber 12 at a location proximate the upper surface of wafer 24 received by wafer support 22. Magnetic field generator 30 in this embodiment also functions as wafer support 22, although a completely separate support for wafer 24 could also be utilized. Magnetic field generator 30 comprises a plurality of conductors 34 received within chamber 12 proximate the wafer support, and which radiate outwardly from a substantially common origin 36 to a periphery 38. In the context of this document, a "common origin" is intended to define any point, member, surface, region of space, or the like, from which or to which the conductors gather or extend. The conductors can constitute conductive traces fabricated in semiconductor substrates or other substrates, shielded or unshielded wires, or the like. In the illustrated example, the plurality of conductors constitute wires which annularly radiate outwardly from a circular or annular origin 36 proximate the support to an annular periphery 38 also proximate the support. A preferred angular step range between the conductors around 360° is every 2.5° to 5°. Example conductor diameter would be between 0.5 mm and 1 mm, with example current being on the order of one ampere to tens of amperes per conductor.

The illustrated support 22 and generator 30 comprise a cylinder-like, or torus-like, body 40 having an upper surface 42 and cylindrical sidewalls 44. An exemplary material of the support portion of generator 30 is a dielectric, such as $SiO_2$. The operative portion of conductors 34 which produce magnetic field 32 are received over top surface 42 from the juncture of sidewalls 44 and top surface 42 (which forms periphery 38) centrally to origin 36. Thus in this example, periphery 38 is received within a common plane 46 (FIG. 1) and is circular (FIG. 2). Conductors 34 are also thereby received over cylindrical top or wafer support area 42 are also essentially oriented in plane 46 to run substantially parallel to a plane of the wafer 24 received over support 22.

Periphery 38 is received outside of wafer periphery 25. Accordingly, conductors 34 are configured to generate magnetic field 32 to be circular proximate the outer wafer surface received by wafer support 22, and to extend outwardly beyond periphery 25. Further, chamber 12 can be considered as having internal sidewalls 19, with conductors 34 being oriented or configured to space magnetic field 32 inwardly away from sidewalls 19.

Origin 36 is circular or annular in shape in the illustrated embodiment and is in the form of a circular surface which defines a central hole extending through the cylinder-like construction. It is oriented centrally relative to top surface 42. Alternately by way of example only, origin 36 might constitute a single conductor extending axially through body 40 and from which conductors 34 collectively extend. Conductors 34 can constitute portions of one or more wires or conductive traces formed or wrapped about cylinder/torus 40 to produce the illustrated or other radiating conductor 34 pattern. Conductors 34 would ultimately extend to, or be connected with conductive traces or wires which extend to, a suitable power supply 48.

In operation, electric current would be caused to flow along the plurality of conductors 34 in a common direction of either toward or away from origin 36. This will generate a substantially continuous magnetic field 32 at a location proximate the conductors between periphery 38 and origin 36, and between individual conductors 34.

Biot-Savart Law predicts that any linear current (such as current flowing relative to a conductor 34) will produce a circular magnetic field about itself. The magnetic field is additive for multiple conductors, so that any superposition of a number of magnetic fields from adjacent conductors will result in one additive vector for each measurement point. Accordingly, with the depicted FIGS. 1 and 2 configuration, magnetic field 32 will be created proximate conductors 34 circularly thereabove having a field vector B directed either counter clockwise or clockwise depending upon the direction of the radial electrical current J. Specifically, when the radial current of all conductors 34 is directed radially inwardly from periphery 38 to origin 36, the resultant magnetic field of interest will be circular above conductors 34 with the magnetic vector pointing counter-clockwise. Likewise, a circular magnetic field will be created below conductors 34 (not shown) with its magnetic vector pointing clockwise. If the current direction is changed to flow from origin 36 radially outwardly in the direction of periphery 38, the magnetic field vectors will also change to be clockwise above and counterclockwise below. Such a field in plasma processing of wafer 24 can facilitate plasma mixing and process uniformity.

Figure 3:
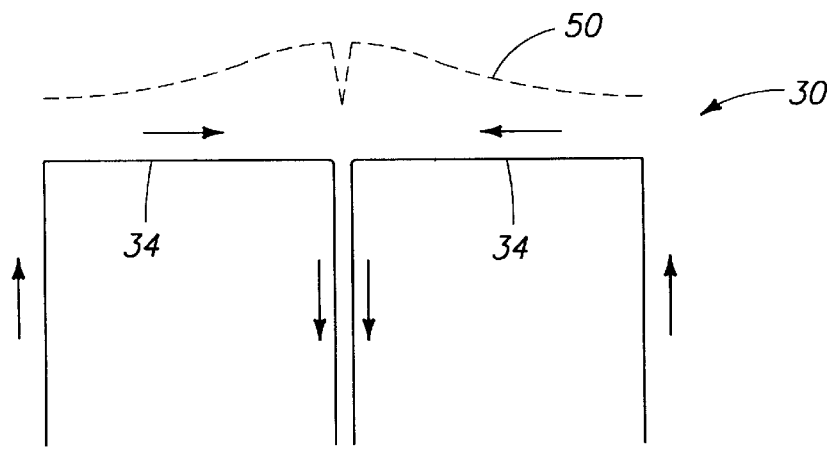
FIG. 3 is a diagrammatic side view of attributes of a magnetic field generating apparatus of FIG. 1.

FIG. 3 diagrammatically and somewhat graphically illustrates the intensity of the magnetic field above the conductors by a line 50 of a magnetic field created by a generator 30. The arrows relative to the conductors illustrate direction of current flow. As is apparent from FIGS. 1 and 2, there is a greater concentration or density of the depicted radially extending conductors 34 more proximate origin 36 than proximate periphery 38. Accordingly, field intensity in the depicted embodiment will be at a peak more proximate the center of the wafer support than peripherally, as depicted by intensity line 50 in FIG. 3. The illustrated intensity would be essentially the same independent of common current direction within conductors 34.

In many semiconductor wafer fabrication operations, it may be more desirable to provide substantially uniform intensity across the magnetic field from a location proximate the center of the wafer to the wafer and field peripheries. Such can be accomplished by a construction diagrammatically depicted in FIG. 4, which illustrates an alternate embodiment magnetic field generator 30a. Like numerals from the first embodiment have been utilized where appropriate, with differences being indicated with the suffix "a" or with different numerals. Here, origin 26a and periphery 38 are received in different planes 46 and 52, wherein origin 26a is positioned further from the supporting portion of the wafer support than is periphery 38. More specifically, in this embodiment the radiating conductors 34a are convexly curved away from plane 46 within which periphery 38 is received, starting at a radial location more proximate periphery 38 than origin 26a. The result is a substantially uniform field intensity 50a across the magnetic field from a location proximate the field and wafer centers to their peripheries. This can result in more uniformity in mix of the plasma, and accordingly in the processing of the wafer.

Figure 5:
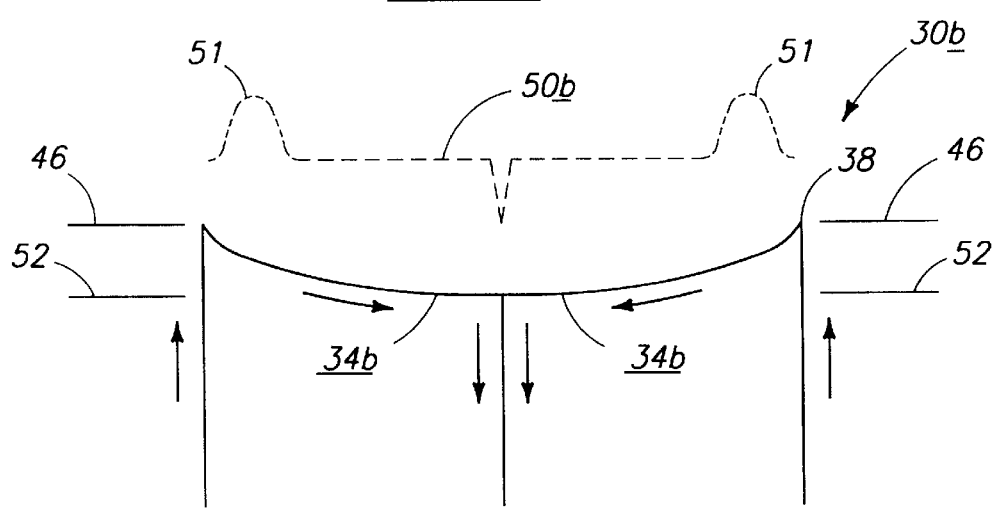
FIG. 5 is a diagrammatic side view of attributes of still another alternate embodiment magnetic field generating apparatus.

FIG. 5 illustrates an alternate embodiment magnetic field generator 30b. Like numerals have been utilized from the first and second described embodiments, with differences being indicated with the suffix "b" or with different numerals. Here, conductors 34b are concavely curved away from plane 46 within which periphery 38 is received. Such configuration will provide field intensity 50b having an annular peak 51 substantially peripherally located within the magnetic field. Such a configuration might be utilized in providing peak field intensity for processing action relative to a wafer to a greater degree at its periphery than at its center.

Figure 4:
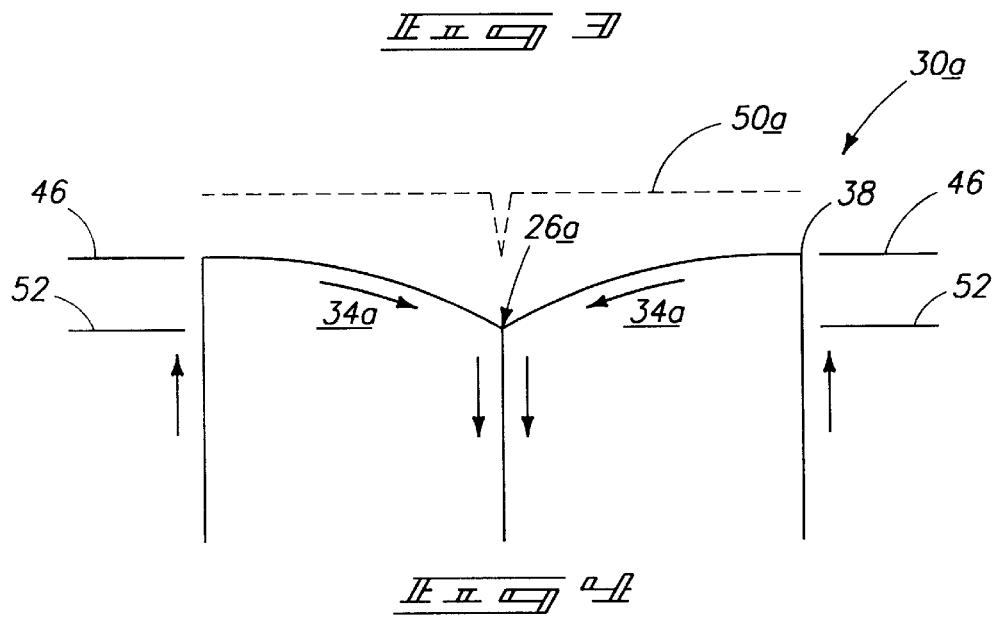
FIG. 4 is a diagrammatic side view of attributes of an alternate embodiment magnetic field generating apparatus.

Upper surface 42 of support or generator 30 in the depicted and described embodiments might be configured to be flexible and shape controllable such that radiating conductors 34 lying thereover can be positioned or configurable in any of the depictions shown by FIGS. 3, 4 and 5, or other configurations. Such provides but one example of how the conductors could be effectively configured to enable variation of intensity of the magnetic field across at least a portion of the wafer support, as selected by a user.

Figure 6:
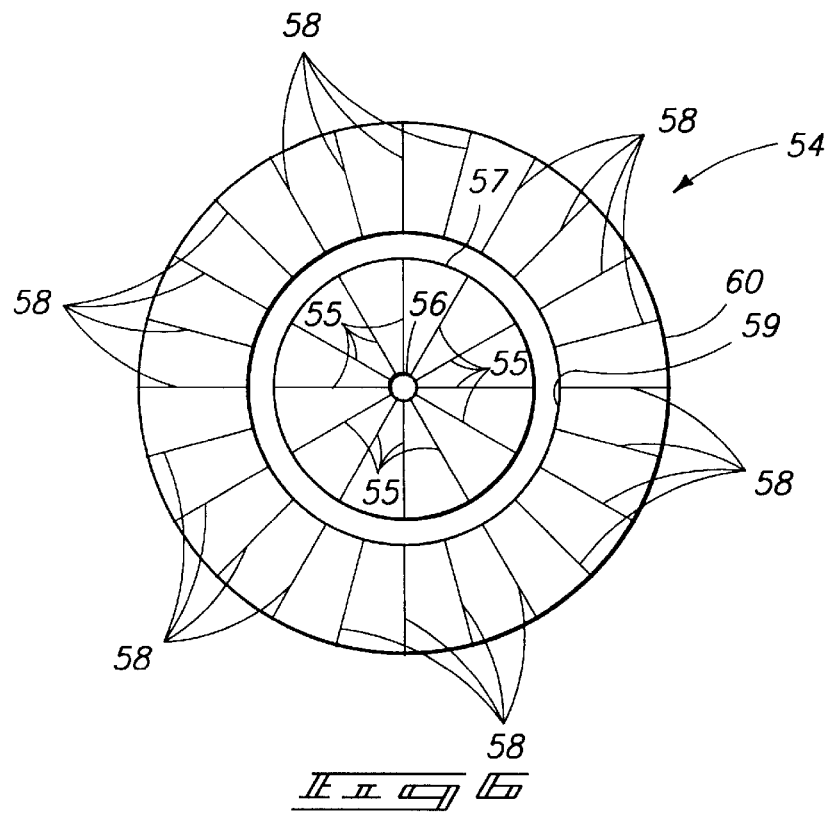
FIG. 6 is a top diagrammatic view of another alternate embodiment magnetic field generating apparatus.

Another possible alternate configuration for the radiating conductors is diagrammatically shown in FIG. 6, where a magnetic field generator 54 is shown. Such comprises a first plurality of conductors 55 radiating outwardly from a first origin 56 to a first periphery 57. Generator 54 also includes a second plurality of conductors 58 annularly radiating outwardly from an annular second origin 59 to an annular second periphery 60. First periphery 57 is at least partially received within second annular periphery 60. In the depicted embodiment, both origins 56 and 59 constitute circular or annular shapes, with the first and second peripheries 57 and 60, respectively, also being circular in shape and concentric with one another. More sets of radiating conductors relative to respective origins and peripheries could also of course be added. Accordingly in this particular embodiment, the generator comprises a plurality of sets of conductors respectively radiating outwardly from respective substantially common origins to respective common peripheries. Magnetic field generator 54 is constructed in this embodiment to provide more second radiating conductors 58 than first radiating conductors 55.

The apparatus is intended to be operated by flowing electric current along both the first and second plurality of conductors commonly toward either their respective peripheries or their respective origins, and generating a substantially continuous magnetic field at a location proximate the first and second plurality of conductors between the annular second periphery and the first origin, not unlike the first described embodiments. Conductors 55 and 58 could be powered by one power supply, or by separate power supplies. If designed to be powered with a single power supply with a goal being to provide substantially uniform field intensity between first origin 56 and second periphery 60, the number and spacing of conductors 58 can be selected relative to that of conductors 55 to provide substantially constant magnetic field intensity over and/or under second conductors 58 as first conductors 55 for a given current flow. If powered by separate sources, the collective conductors are thereby effectively configured to enable variation of intensity of the magnetic field across at least a portion of the wafer support to produce, for example, any of the intensity profiles depicted by FIGS. 3, 4 and 5.

Figure 7:
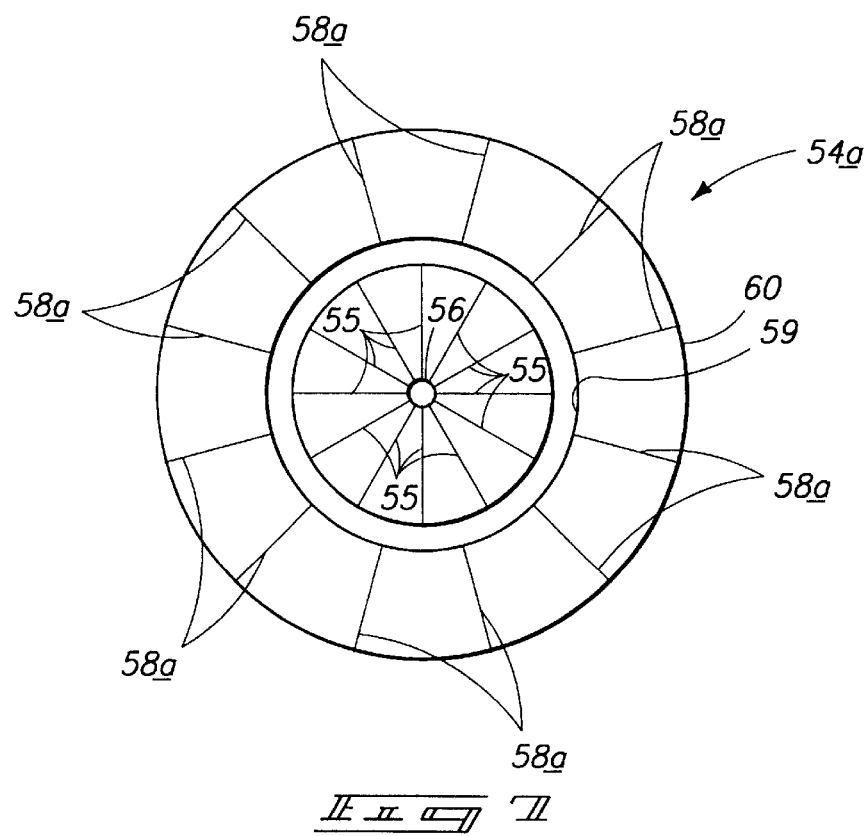
FIG. 7 is a top diagrammatic view of still another embodiment magnetic field generating apparatus.

FIG. 7 illustrates an alternate embodiment magnetic field generator 54a. Like numerals from the FIG. 6 embodiment are utilized where appropriate, with differences being indicated with the suffix "a" or with different numerals. Here for example, second radiating conductors 58a are the same in number as first radiating conductors 55. Accordingly where constant field intensity were desired, significantly greater current could be applied relative to conductors 58a than to conductors 55 when using separate power supplies. Alternately, the power could be stepped down relative to conductors 55 as compared to conductors 58a with a single power supply setup.

Figure 8:
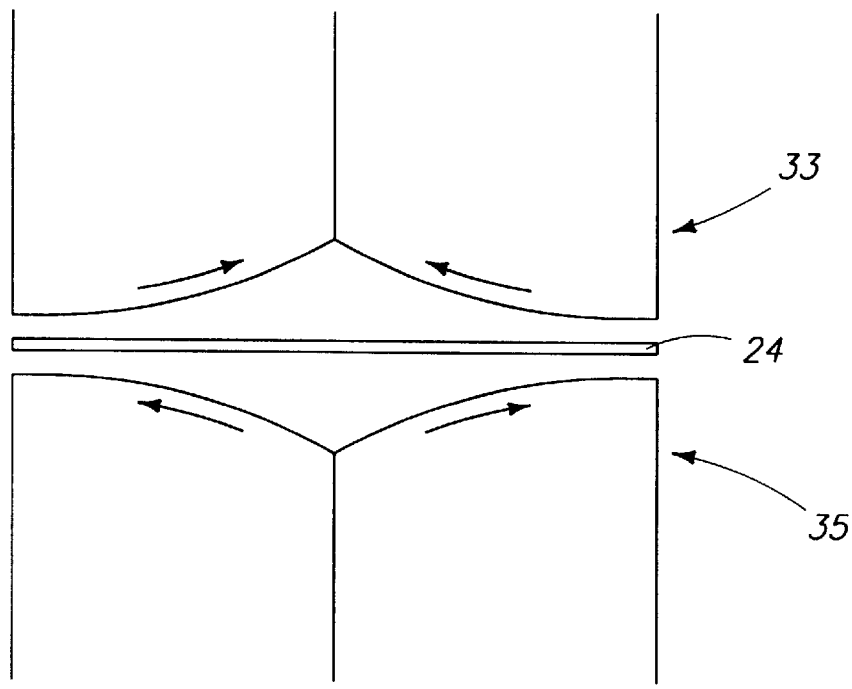
FIG. 8 is a diagrammatic side view of an alternate embodiment magnetic field generating apparatus.

FIG. 8 illustrates another alternate configuration employing two magnetic field generators. Specifically, a two generator 33, 35 system is shown having a wafer 24 interposed therebetween. The construction of generators 33 and 35 is largely analogous to that of generator 30b in FIG. 4, although other constructions could of course be utilized. Current flow would be opposing, as shown, with respect to the two generators to provide common direction magnetic field vectors in a common magnetic field created proximate the wafer by the two generators.

Figure 9:
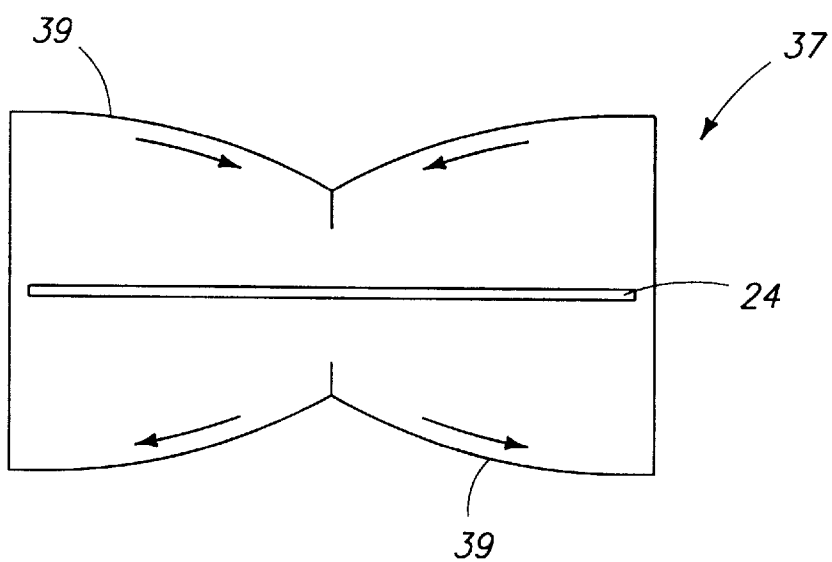
FIG. 9 is a diagrammatic side view of still another alternate embodiment magnetic field generating apparatus.

FIG. 9 illustrates another alternate configuration effectively employing two magnetic field generators. Here, a wafer is positioned within a cylindrical-like body 37 about which conductors 39 are effectively received. Magnetic fields are created both above and below the radiating conductors. A configuration such as the depicted example can be arranged to concentrate a common magnetic field within the cylindrical-like, or other shaped, body proximate a wafer 24 received therein. Current flow would ideally be selected to be opposing, as shown, with respect to the two generators to provide common direction magnetic field vectors in the common magnetic filed created proximate the wafer by the two generators. The peripheral vertically extending conductors would facilitate spacing of the field inwardly from the walls of the chamber.

The above described preferred embodiments were relative to semiconductor wafer processor constructions. The invention also contemplates plasma generating apparatus within or apart from the semiconductor wafer fabrication arts. For example, FIG. 1 inherently does depict a plasma generating apparatus comprising a chamber 12, a plasma generator construction 20 configured to generate a plasma 28 within chamber 12; and a magnetic field generator 30 comprising a plurality of conductors 34 within chamber 12 which radiate outwardly from a substantially common origin 36 to a periphery 38. In the exemplary depicted embodiments, the plasma generator and magnetic field generator constitute different inherent devices. The invention also contemplates fabrication of the plasma generator and the magnetic field generator to be one and the same. For example, magnetic field generator 30 could be fabricated with a sufficient quantity of conductors in sufficient proximity to one another, with a suitable power supply, to enable inherent plasma generation upon inducement of a sufficiently strong magnetic field.

Figure 10:
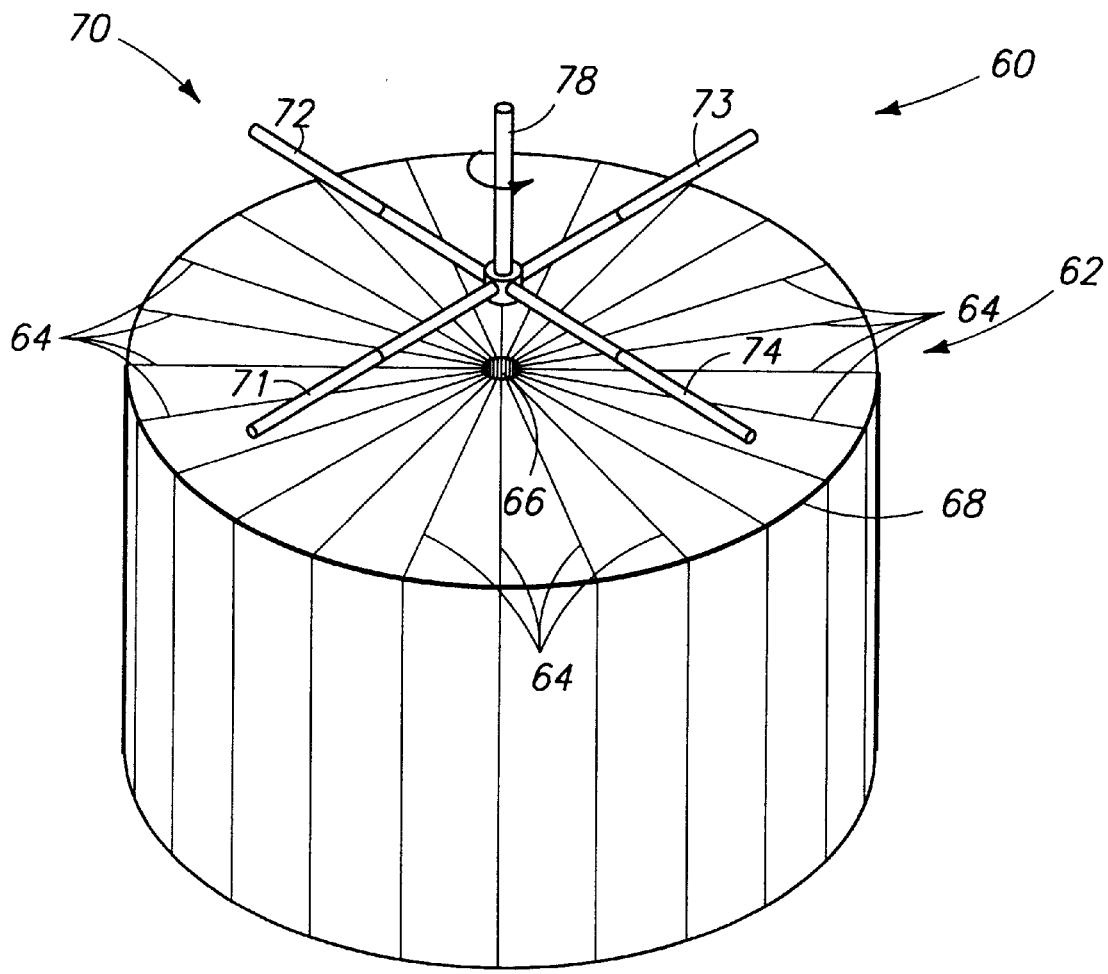
FIG. 10 is a perspective diagrammatic view of an electric motor in accordance with the invention.

FIG. 10 depicts application of the invention in an electric motor 60. Such comprises a magnetic field generator 62 having any of the attributes and constructions of the magnetic field generators described above. Accordingly, such comprises a plurality of conductors radiating outwardly from a substantially common origin 66 to a periphery 68. Generator 62 is configured to generate a magnetic field at a location proximate conductors 64 between origin 66 and periphery 68 and between conductors 64. A magnet 70 (i.e., some magnetic device) is oriented and mounted to rotate within the location upon generation of the magnetic field. The depicted embodiment comprises four magnetic bars 71, 72, 73 and 74 radially projecting outwardly from a shaft 78 supported for rotation substantially centrally over origin 66. The bars 71, 72, 73 and 74 are oriented with their north poles radially inward and their south poles radially outward, although such could of course be reversed. For current flow within conductors 64 radially outward from origin 66 to periphery 68, the magnetic field force vectors will be in the clockwise direction causing shaft 78 to be driven or rotated counter clockwise.

The motor construction could be configured to produce a magnetic field such as any of those described above with respect to the plasma generating apparatus and semiconductor wafer processor apparatus. Preferably, the construction is provided to produce a field intensity like FIG. 5 wherein peak intensity is peripherally located relative to the magnetic field. This will provide the greatest torque or driving power radially outward relative to shaft 78, and thus maximize driving force for given applied power which produces the magnetic field.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor wafer processor comprising:
   a chamber having a wafer support, the wafer support defining a plane; and
   a magnetic field generator configured to generate a magnetic field within the chamber at a location proximate a surface of a wafer received by the wafer support, the magnetic field generator comprising a plurality of conductors within the chamber proximate the support which radiate outwardly from a substantially common origin to a periphery, the plurality of conductors being disposed entirely to one side of the plane defined by the wafer support.

2. The semiconductor wafer processor of claim 1 wherein the conductors form a toroidal inductor and are configured to generate the magnetic field to be circular proximate a surface of a wafer received by the wafer support.

3. The semiconductor wafer processor of claim 1 wherein the chamber has internal sidewalls, and the conductors are configured to space the magnetic field inwardly away from said sidewalls.

4. The semiconductor wafer processor of claim 1 wherein the periphery is received outside of a periphery of a wafer adapted to be received by the wafer support.

5. The semiconductor wafer processor of claim 1 wherein the conductors are configured to generate the magnetic field to be circular proximate a surface of a wafer received by the wafer support, and to extend radially beyond a periphery of said wafer.

6. The semiconductor wafer processor of claim 1 wherein the generator comprises at least part of the wafer support.

7. The semiconductor wafer processor of claim 1 wherein the periphery is received within a common plane disposed below the plane defined by the wafer support.

8. The semiconductor wafer processor of claim 1 wherein the periphery is circular and received within a common plane disposed below the plane defined by the wafer support.

9. The semiconductor wafer processor of claim 1 wherein the generator comprises a plurality of sets of conductors respectively radiating outwardly from respective substantially common origins to respective common peripheries.

10. The semiconductor wafer processor of claim 1 wherein the conductors are configured to enable variation of intensity of the magnetic field across at least a portion of the wafer support.

11. The semiconductor wafer processor of claim 1 wherein the conductors are configured to provide substantially uniform field intensity across the magnetic field from a location proximate the center of the field to the field periphery in the plane defined by the wafer support.

12. The semiconductor wafer processor of claim 1 wherein the conductors form a toroidal inductor and are configured to provide peak field intensity in the plane defined by the wafer support at a location more proximate the center of the wafer support than peripherally.

13. The semiconductor wafer processor of claim 1 wherein the conductors are configured to provide, in the plane defined by the wafer support, peak field intensity substantially peripherally in the magnetic field.

14. The semiconductor wafer processor of claim 1 wherein the magnetic field generator comprises a torus having an upper surface within which conductors are oriented in a plane running substantially parallel to, and to one side of, a plane of a wafer received by the wafer support.

15. The semiconductor wafer processor of claim 1 comprising a plurality of said magnetic field generators configured to generate a substantially common magnetic field within the chamber at a location proximate said wafer surface.

16. A semiconductor wafer processor comprising:
a chamber having a wafer support, the wafer support defining a plane; and
a magnetic field generator configured to generate a magnetic field within the chamber at a location proximate a surface of a wafer received by the wafer support, the magnetic field generator comprising a plurality of conductors within the chamber proximate the support which annularly radiate outwardly from an annular origin proximate the support to an annular periphery proximate the support, the origin and periphery being in different planes, the plurality of conductors being disposed entirely to one side of, and not intersecting, the plane defined by the wafer support.

17. The semiconductor wafer processor of claim 16 wherein the annular origin and annular periphery are both circular in shape.

18. The semiconductor wafer processor of claim 16 wherein the plurality of conductors comprise a toroid and the radiating conductors are convexly curved away from a plane within which the periphery is received and from the plane defined by the wafer support.

19. The semiconductor wafer processor of claim 16 wherein the radiating conductors are convexly curved away from a plane within which the periphery is received starting at a radial location more proximate the periphery than the origin.

20. The semiconductor wafer processor of claim 16 wherein the radiating conductors are concavely curved away from a plane within which the periphery is received.

21. The semiconductor wafer processor of claim 16 wherein the origin is positioned further from the plane defined by the support than from the periphery.

22. The semiconductor wafer processor of claim 21 wherein the radiating conductors are convexly curved away from a plane within which the periphery is received starting at a radial location more proximate the periphery than the origin.

23. The semiconductor wafer processor of claim 21 wherein the radiating conductors are concavely curved away from a plane within which the periphery is received.

24. The semiconductor wafer processor of claim 16 wherein the generator comprises at least part of the wafer support.

25. The semiconductor wafer processor of claim 16 wherein the conductors are configured to generate the magnetic field to be circular in the plane defined by the support and proximate a surface of a wafer received by the wafer support.

26. The semiconductor wafer processor of claim 16 wherein the periphery is received outside of a periphery of a wafer adapted to be received by the wafer support.

27. The semiconductor wafer processor of claim 16 wherein the conductors are configured to generate the magnetic field to be circular in the plane defined by the support and proximate a surface of a wafer received by the wafer support, and to extend radially beyond a periphery of said wafer.

28. The semiconductor wafer processor of claim 16 wherein the chamber has internal sidewalls, and the conductors are configured to space the magnetic field inwardly away from said sidewalls.

29. The semiconductor wafer processor of claim 16 comprising a plurality of said magnetic field generators disposed outside and not intersecting the plane defined by the wafer support and configured to generate a substantially common magnetic field within the chamber in the plane defined by the wafer support and at a location proximate said wafer surface.

30. A semiconductor wafer processor comprising:
a chamber having a wafer support including a surface defining a plane; and
a magnetic field generator configured to generate a magnetic field within the chamber at a location proximate a surface of a wafer received by the wafer support, the magnetic field generator comprising a first plurality of conductors radiating outwardly from a first origin to a first periphery; and a second plurality of conductors annularly radiating outwardly from an annular second origin to an annular second periphery, the first periphery being received at least partially within the second annular periphery, the first and second pluralities of conductors being disposed entirely to one side of, and not intersecting, the plane defined by the wafer support.

31. The semiconductor wafer processor of claim 30 wherein the first periphery is received entirely within the second annular periphery.

32. The semiconductor wafer processor of claim 30 wherein there are more second radiating conductors than first radiating conductors.

33. The semiconductor wafer processor of claim 30 wherein the first and second peripheries are circular in shape and concentric with one another.

34. The semiconductor wafer processor of claim 30 wherein the first plurality of conductors and the second plurality of conductors radiate between their respective origins and peripheries in respective planes.

35. The semiconductor wafer processor of claim 30 wherein the first plurality of conductors and second plurality of conductors radiate between their respective origins and peripheries in a common plane.

36. The semiconductor wafer processor of claim 30 wherein the first and second plurality of conductors are configured to generate the magnetic field to be circular in the plane defined by the wafer support surface and proximate a surface of a wafer received by the wafer support.

37. The semiconductor wafer processor of claim 30 wherein the generator comprises at least part of the wafer support.

38. The semiconductor wafer processor of claim 30 wherein the first and second plurality of conductors are configured to provide substantially uniform field intensity across the magnetic field from a location proximate the center of the field to the periphery of the field.

39. The semiconductor wafer processor of claim 30 wherein the first and second plurality of conductors each form respective first and second toruses having top surfaces that are both oriented in a common plane running substantially parallel to a plane of the wafer received by the wafer support.

40. The semiconductor wafer processor of claim 30 wherein the chamber has internal sidewalls, and the conductors are configured to space the magnetic field inwardly away from said sidewalls.

41. A plasma generating apparatus comprising:

a chamber; and a magnetic field generator configured to generate a magnetic field within the chamber, the magnetic field generator comprising a first torus including a first plurality of conductors including portions radiating outwardly from a first origin to a first periphery; and a second torus including second plurality of conductors including portions annularly radiating outwardly from an annular second origin to an annular second periphery, the first periphery being received at least partially within the second annular periphery, the first and second pluralities of conductors being disposed entirely to one side of, and not intersecting, a plane defined by a wafer support work surface.

42. The plasma generating apparatus of claim 41 wherein the first periphery is received entirely within the second annular periphery.

43. The plasma generating apparatus of claim 41 wherein there are more second radiating conductors than first radiating conductors.

44. The plasma generating apparatus of claim 41 wherein the first and second peripheries are circular in shape and concentric with one another.

45. The plasma generating apparatus of claim 41 wherein the first plurality of conductors and second plurality of conductors comprise toroids and the first plurality of conductors and second plurality of conductors radiate between their respective origins and peripheries in respective planes disposed parallel to the plane defined by the wafer support work surface.

46. The plasma generating apparatus of claim 41 wherein the first plurality of conductors and second plurality of conductors radiate between their respective origins and peripheries in a common plane disposed parallel to the plane defined by the wafer support work surface.

47. The plasma generating apparatus of claim 41 wherein the chamber has internal sidewalls, and the conductors are configured to space the magnetic field inwardly away from said sidewalls.

48. The semiconductor wafer processor of claim 1 wherein the magnetic field generator is disposed entirely to one side of the plane defined by the wafer support.

49. The semiconductor wafer processor of claim 1 wherein the magnetic field generator is disposed entirely beneath the plane defined by the wafer support.

50. The semiconductor wafer processor of claim 1 wherein the magnetic field generator does not intersect the plane defined by the wafer support.

51. The semiconductor wafer processor of claim 16 wherein the magnetic field generator is disposed entirely to one side of the plane defined by the wafer support.

52. The semiconductor wafer processor of claim 16 wherein the magnetic field generator is disposed entirely beneath the plane defined by the wafer support.

53. The semiconductor wafer processor of claim 16 wherein the magnetic field generator does not intersect the plane defined by the wafer support.

54. The semiconductor wafer processor of claim 30, wherein the magnetic field generator is disposed entirely to one side of the plane defined by the wafer support.

55. The semiconductor wafer processor of claim 30 wherein the magnetic field generator is disposed entirely beneath the plane defined by the wafer support.

56. The semiconductor wafer processor of claim 30 wherein the magnetic field generator does not intersect the plane defined by the wafer support.

57. The plasma generating apparatus of claim 41 wherein the magnetic field generator is disposed entirely to one side of the plane defined by the wafer support work surface.

58. The plasma generating apparatus of claim 41 wherein the magnetic field generator is disposed entirely beneath the plane defined by the wafer support work surface.

59. The plasma generating apparatus of claim 41 wherein the magnetic field generator does not intersect the plane defined by the wafer support work surface.

* * * * *